(12) United States Patent
Maslen

(10) Patent No.: US 6,497,272 B1
(45) Date of Patent: Dec. 24, 2002

(54) SINGLE CRYSTAL CASTING MOLD

(75) Inventor: James D. Maslen, Landing, NJ (US)

(73) Assignee: Howmet Research Corporation, Whitehall, MI (US)

( * ) Notice: Subject to any disclaimer, the term of this patent is extended or adjusted under 35 U.S.C. 154(b) by 0 days.

(21) Appl. No.: 09/417,737

(22) Filed: Oct. 14, 1999

(51) Int. Cl.[7] ............................................. B22C 9/04
(52) U.S. Cl. ..................... 164/516; 164/122.2; 164/361
(58) Field of Search ........................... 164/122.1, 122.2, 164/361, 516

(56) References Cited

U.S. PATENT DOCUMENTS

| | | | |
|---|---|---|---|
| 3,260,505 A | * 7/1966 | Ver Snyder | .................. 416/179 |
| 3,494,709 A | * 2/1970 | Piearcey | ..................... 416/232 |
| 3,759,310 A | * 9/1973 | Barrow et al. | .............. 164/495 |
| 4,133,368 A | * 1/1979 | Hayes | .......................... 164/35 |
| 4,180,119 A | * 12/1979 | Burd et al. | .................... 164/34 |
| 4,450,889 A | * 5/1984 | Grot | ........................... 164/361 |
| 4,453,588 A | * 6/1984 | Goulette et al. | ............ 164/352 |
| 4,475,582 A | 10/1984 | Giamei et al. | ........... 164/122.2 |
| 4,580,613 A | * 4/1986 | Miller et al. | ................... 164/35 |
| 4,612,969 A | 9/1986 | Burd et al. | ............... 164/122.2 |
| 4,714,101 A | 12/1987 | Terkelson | ................ 164/122.2 |
| 4,804,311 A | 2/1989 | Anderson et al. | ........... 415/191 |
| 4,940,073 A | 7/1990 | Jeyarajan et al. | ........... 164/361 |
| 5,062,468 A | * 11/1991 | Monte et al. | ............ 164/122.2 |
| 5,062,469 A | 11/1991 | Monte et al. | ............ 164/122.2 |

FOREIGN PATENT DOCUMENTS

| | | | |
|---|---|---|---|
| EP | 0 100 150 | 8/1984 | |
| EP | 0 126 550 A1 | * 11/1984 | ........... B22D/27/00 |
| GB | 2 037 200 A | 7/1980 | |
| JP | 146 707 | 4/1985 | |
| WO | 94/18 363 | 8/1994 | |

* cited by examiner

Primary Examiner—M. Alexandra Elve
Assistant Examiner—Kevin P. Kerns

(57) ABSTRACT

A mold for single crystal casting of molten metallic material is provided having a metallic seed crystal with a passage in an end thereof and an end of a fugitive connector member inserted in the passage. Another end of the connector member is connected to a fugitive pattern. The assembled seed crystal, member, and pattern are invested in a ceramic shell mold so that the mold is invested directly against a side of the seed crystal.

7 Claims, 2 Drawing Sheets

SINGLE CRYSTAL CASTING MOLD

FIELD OF THE INVENTION

The present invention relates to single crystal casting using a seed crystal in a grain starter cavity of a ceramic shell mold.

BACKGROUND OF THE INVENTION

Single crystal casting and solidification of molten metal using a ceramic investment shell mold positioned on a chill plate is well known in the art of investment casting to produce such components as single crystal gas turbine engine blades and vanes. In one mode of single crystal casting, the ceramic shell mold includes a lower grain starter cavity having a seed crystal positioned therein and contacting a chill plate. The seed crystal is communicated to an upper mold cavity by a helical passage often referred to as a "pigtail". The seed crystal is placed in the lower starter cavity of a ceramic shell mold that is preformed using the well known lost wax process. When molten metal is introduced into the shell mold, a single crystal is expected to grow epitaxially upwardly from the seed crystal with a preselected crystallographic orientation determined by the seed for propagation through the molten metal in the mold cavity. During single crystal solidification, the melt-filled shell mold is withdrawn from a casting furnace to establish unidirectional heat removal from the molten metal in the mold to produce a solidification front of the single crystal through the molten metal in the mold cavity to form the single crystal casting.

Inconsistencies in the fit of the seed crystal in the lower starter cavity of the preformed ceramic shell mold can result in seepage of molten metal or alloy around the seed between the seed and the adjacent mold wall. When this molten flash material solidifies, it can nucleate multiple grains that grow in the starter cavity instead of the expected single crystal. Such spurious grain nucleation and growth in the starter cavity can result in an increase in scrap castings by virtue of their having a grain orientation outside a preselected specification (e.g. where the [001] crystal axis must be within a certain range of degrees relative to the z axis of the turbine airfoil).

An object of the present invention is to provide a method and apparatus for making a single crystal casting mold that overcome the above problem of spurious grain nucleation and growth that leads to increased scrap castings due to grain misorientation.

SUMMARY OF THE INVENTION

In one embodiment, the present invention provides method and apparatus for making single crystal casting mold wherein a preformed metallic seed crystal includes a seed passage in which one end of a fugitive connector member is inserted. The seed crystal comprises a metal or alloy similar or identical in composition to that to be solidified in the mold and having a desired crystal orientation. The other end of the connector member is connected to a fugitive pattern of the article to be cast. A ceramic shell mold is formed about the assembly of the seed crystal, connector member and pattern so as to directly contact the seed crystal to embed it integrally in the mold. The connector member and pattern then are removed, leaving a ceramic shell mold having the seed crystal embedded in the mold at the lower mold end with the seed communicated by a mold passage to a mold cavity having the shape of the article to be cast.

In an illustrative embodiment of the invention, an end of the seed crystal is drilled to form an axially extending passage to receive the end of a fugitive thermoplastic helical or straight connector member in close tolerance fit. A fugitive (e.g. wax) pattern ramp is joined to the other end of the connector member and then to a fugitive (e.g. wax) pattern of the article to be cast. The ceramic shell mold then is invested about the assembly by repeatedly dipping in ceramic slurry, draining excess slurry and stuccoing to build up a desired shell mold wall thickness such that the shell mold is invested directly against a side of the seed crystal to embed it in the mold. The fugitive connector member, ramp and pattern are removed from the invested assembly. A ceramic shell mold remains having the seed crystal embedded therein with the drilled end of the seed communicated by a mold passage to a mold cavity having the shape of the article to be cast. When molten metal or alloy is cast and solidified in the mold, seepage of molten metal or alloy between the seed and the mold wall that occurred heretofore and caused spurious grain nucleation in the starter cavity is essentially eliminated by virtue of the absence of any misfit between the seed and mold wall. That is, the shell mold is formed directly about and in direct contact with the side of the seed during the mold formation process to eliminate misfit therebetween.

The present invention thereby provides a method and apparatus for single crystal casting that substantially reduces scrap castings due to grain misorientation from spurious grain nucleation proximate the seed crystal.

The above objects and advantages of the present invention will become more readily apparent from the following detailed description taken with the following drawings.

DESCRIPTION OF THE DRAWINGS

FIG. 3 is an elevational view of a seed crystal assembled to a fugitive connector member, fugitive pattern ramp and fugitive pattern of the article to be cast pursuant to another embodiment of the invention where like features are represented by like reference numerals.

DESCRIPTION OF THE INVENTION

An illustrative embodiment of the present invention involves method and apparatus for single crystal casting of molten metals and alloys, such as nickel base superalloys, cobalt base superalloys or other superalloys used in casting of airfoils including turbine blades and vanes of a gas turbine engine.

Figure 1:
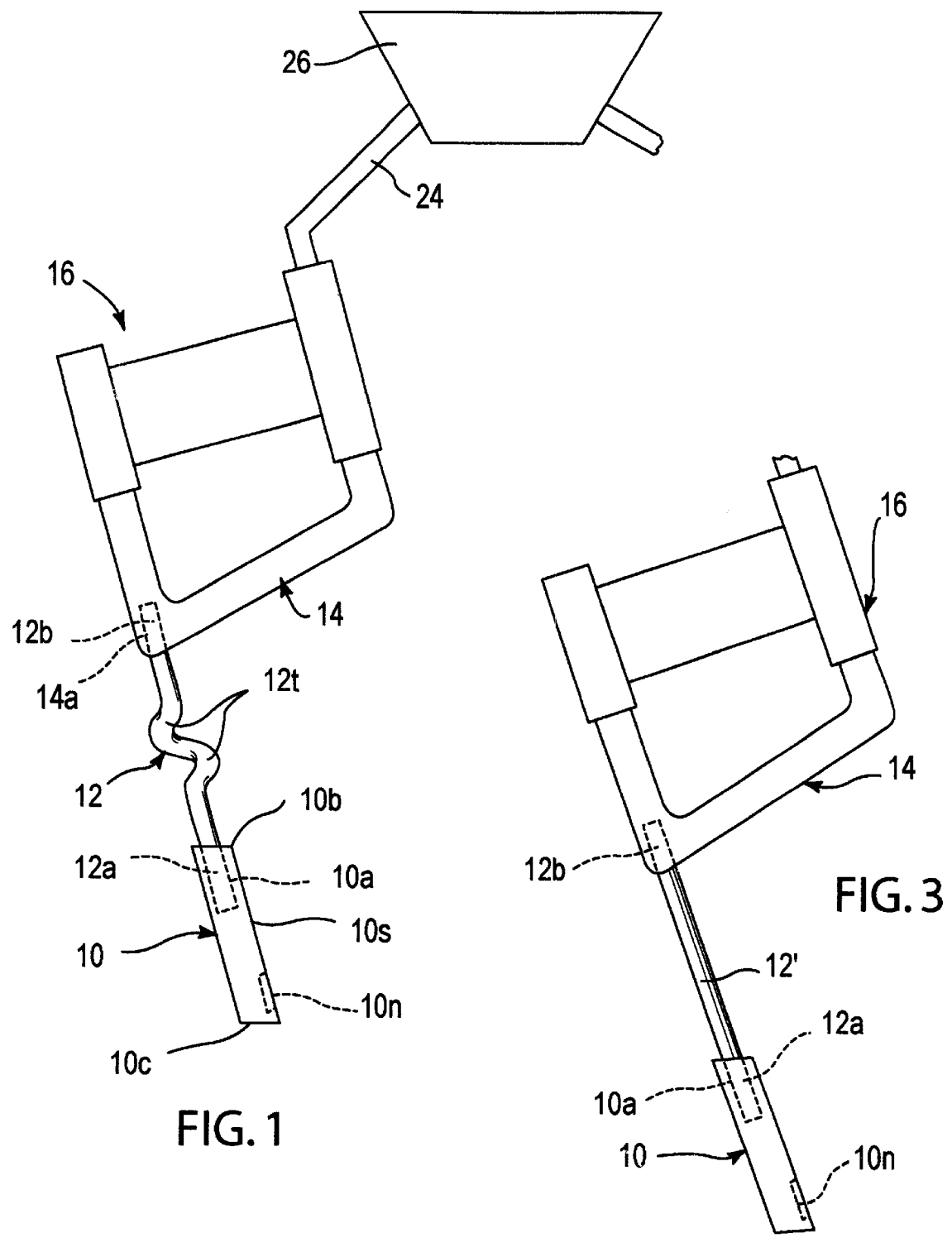
FIG. 1 is an elevational view of a seed crystal assembled to a fugitive connector member, fugitive pattern ramp and fugitive pattern of the article to be cast.

Referring to FIG. 1, a metallic seed crystal 10 is shown assembled to a fugitive connector member 12, which in turn is shown connected to a fugitive pattern ramp 14 and fugitive pattern 16 of the article to be cast, shown as a gas turbine engine airfoil. The seed crystal 10 preferably comprises a metal or alloy similar or identical in composition to that to be solidified in the mold. For illustration only, when the molten metal to be cast comprises a nickel base alloy, the seed crystal comprises the same alloy (i.e. same alloy composition) or a similar alloy composition. The seed crystal is provided with a crystallographic orientation to be imparted to the single crystal casting by epitaxial solidification as is well known. For example only, for most face centered cubic nickel base superalloys, the seed crystal can have a [001] crystal axis oriented parallel and/or perpendicular to the z axis of a turbine airfoil to be cast in the mold cavity 20a, FIG. 2.

The seed crystal 10 includes a notch or other recess 10n in a side 10s near the base thereof. The notch is adapted to receive mold material during the mold formation process, whereby the seed crystal will be locked in position against rotary and axial motion in the investment mold 20 (see FIG. 2).

For purposes of illustration only, the connector member 12 is shown comprising an optional elongated, solid molded thermoplastic helix having up to two turns 12t between first and second ends 12a, 12b and a cylindrical cross-section. In lieu of a helical member, a simple straight member 12' of a solid, cylindrical or other cross-section can be disposed between the seed crystal 10 and the ramp 14 as shown in FIG. 3. The connector member 12 can comprise a non-brittle thermoplastic, such as commercially available Deltech PS148 Prime thermoplastic, having sufficient strength to support the pattern assembly weight above the member 12.

Pursuant to an embodiment of the invention, a straight lower end 12a of the connector member 12 is connected directly to the seed crystal 10, while a straight upper end 12b is connected to the fugitive pattern 16 via the pattern ramp 14.

In particular, an axial end 10b of seed crystal 10 is drilled with a carbide drill bit (not shown) to form an axially extending passage 10a having a selected depth and inner diameter to receive the lower end 12a of the connector member 12 in interference fit. For purposes of illustration only, the passage 12a can have an inner diameter of 0.25 inch to receive the end 12a having an outer diameter of 0.25 inch. The passage 10a has a depth of 0.400 inch, and the end 12a is received to a depth of 0.400 inch in the passage 10a. The total height of the seed crystal 10 is 1.65 inches in this instance.

Before insertion of end 12a in the passage 10a, a suitable Adhesive is placed in the passage 10a to provide an adhesive bond between the end 12a and wall of the seed crystal 10 defining the passage 10a. A suitable adhesive is commercially available as Permabond cyanoacrylate adhesive. If a helical member 12 is used and inserted, the first turn 12t of the helix points toward the z axis of a gas turbine engine vane to be cast (i.e. toward the enter of the mold to be formed).

The other end 12b of the connector member 12 then is inserted into a preformed hole 14a of the fugitive pattern ramp 14, which typically is injection molded of conventional pattern wax. For purposes of illustration only, the passage 14a can have an inner diameter of 0.25 inch to receive the end 12b having an outer diameter of 0.25 inch. The passage 14a has a depth of 0.40 inch, and the end 12b is received to a depth of 0.40 inch in the passage 14a.

The pattern ramp then is joined by wax welding or other technique to the fugitive pattern 16 of the article to be cast. The pattern 16 typically is injection molded of conventional pattern wax. The ramp 14 can be injection molded integrally with the pattern 16 rather than being wax welded thereto.

Figure 2:
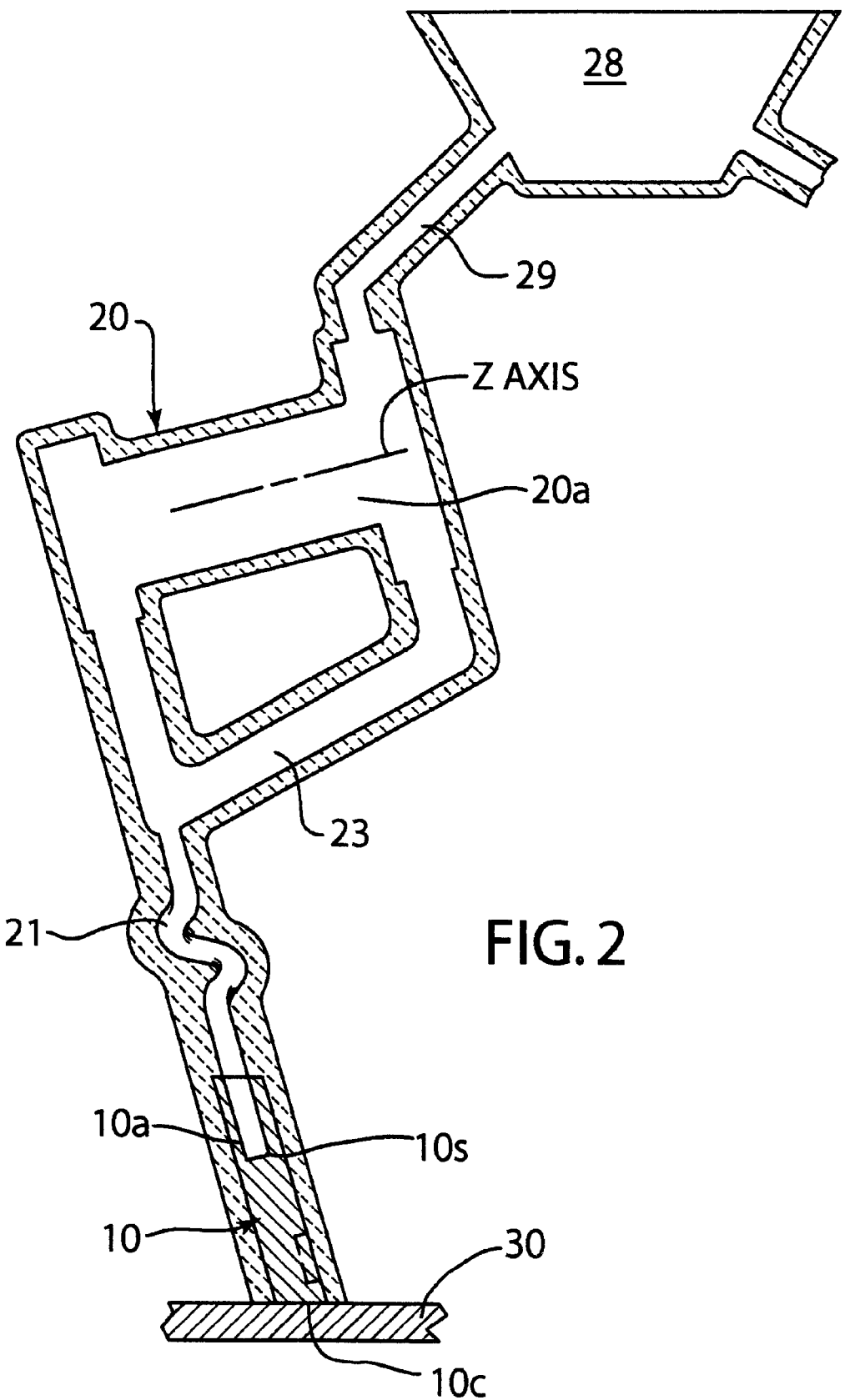
FIG. 2 is a sectional view of a ceramic investment shell mold made using the assembly of FIG. 1 after the fugitive components are removed.

The assembly of the seed crystal 10, connector member 12, ramp 14, and pattern 16 is joined by wax sprue-forming member 24 to other like assemblies about a central wax pour cup 26 to form a gang mold having a plurality of the molds 20 disposed about the pour cup 28, FIG. 2, and each communicated thereto by sprue passage 29. The assembly is invested in ceramic by repeatedly dipping the assembly in ceramic slurry, draining excess slurry and stuccoing the slurry-coated pattern with ceramic stucco particulates to build up a shell mold of desired mold wall thickness on the pattern. For example, a shell mold wall thickness of about 0.375 inch can be formed about the assembly using zircon based ceramic slurry and alumina stucco. The end 10c of the seed crystal 10 that will contact a chill plate 30 during single crystal casting is prevented from being covered by ceramic material by wax masking of end 10c.

After the shell mold 20 is formed to desired thickness on the assembly, the fugitive connector member 12, ramp 14, pattern 16 and other fugitive components are selectively removed from each mold 20. The fugitive assembly components can be removed thermally, such as by melting and/or burning, by dissolution or by other means to leave ceramic shell mold 20, which then is fired at elevated temperature prior to casting to develop suitable mold strength for casting. For example, the ceramic shell mold with the assembly therein can be heated to 1500 degrees F. for 2 hours to melt and/or burn the fugitive connector member 12, ramp 14, pattern 16 and other fugitive components out of the ceramic shell mold.

The resulting ceramic shell mold 20 each includes the seed crystal 10 embedded therein at the lower end and communicated by a helical or straight mold passage 21 and ramp passage 23 to a mold cavity 20a having the shape of the article to be cast. That is, the shell mold 20 is formed directly about and in direct contact with side 10s of the seed 10 during the mold formation process to embed it in the mold and eliminate misfit therebetween. The seed crystal 10 will be locked in position by ceramic mold material residing in the notch or recess 10n near the base of the seed crystal 10. The seed crystal 10 will include empty seed passage 10a facing upwardly and communicated to the mold cavity 20a by passages 21, 23. When molten metal or alloy is cast into the mold 20 and solidified, seepage of molten metal or alloy between the embedded seed 10 and the mold 20 that heretofore occurred and caused spurious grain nucleation in the starter cavity is essentially eliminated by virtue of the absence of any misfit between the seed 10 and the mold 20. Casting defects due to grain misorientation are significantly reduced by practice of the invention. The presence of the empty passage 10a in the seed crystal 10 after removal of the helical member, ramp and pattern allows molten metal or alloy to penetrate into the seed crystal to help melt it. The single crystal casting process is described in such patents as Ver Snyder U.S. Pat. No. 3,260,505 and Piearcey U.S. Pat. No. 3,494,709, which are incorporated by reference herein.

Although the invention has been described in detail above with respect to certain embodiments, those skilled in the art will appreciate that modifications, changes and the like can be made therein without departing from the spirit and scope of the invention as set forth in the appended claims.

I claim:

1. A method of making a mold for single crystal casting of molten metallic material, comprising providing a metallic seed crystal with a passage in an end thereof, connecting an end of a fugitive connector member in said passage, connecting another end of said fugitive connector member to a fugitive pattern having a configuration of an article to be cast, investing the assembled seed crystal, fugitive connector member and fugitive pattern in a ceramic shell mold so that said mold is invested directly against a side of said seed crystal, and removing the fugitive connector member and the fugitive pattern from said shell mold, leaving said shell mold invested directly against said side of said seed crystal.

2. The method of claim 1 wherein said seed crystal is drilled to form said passage.

3. The method of claim 1 wherein said end of said member is inserted axially in said passage.

4. The method of claim 1 wherein said end of said member is adhered in said passage.

5. A mold for single crystal casting of molten metallic material, comprising a ceramic shell mold having a metallic seed crystal, a mold passage extending from an end of said seed crystal to a mold cavity, said seed crystal having a passage in said end thereof and said mold being invested directly against a side of said seed crystal to embed said side in said mold to reduce spurious grain nucleation in molten metallic material cast in the shell mold resulting from seepage of the molten metallic material between said seed crystal and said shell mold.

6. The mold of claim 5 wherein said seed passage is disposed in an axial end of said seed crystal.

7. The mold of claim 5 wherein said seed passage extends axially into said seed crystal.

* * * * *